United States Patent
Dani et al.

(10) Patent No.: US 7,808,283 B2
(45) Date of Patent: Oct. 5, 2010

(54) SYNCHRONOUS FREQUENCY SYNTHESIZER

(75) Inventors: Praveen Dani, San Jose, CA (US); Robert Fulton, Rancho Cordova, CA (US); Andrew M. Volk, Granite Bay, CA (US); Surya Musunuri, Roseville, CA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 12/238,189

(22) Filed: Sep. 25, 2008

(65) Prior Publication Data

US 2010/0073035 A1 Mar. 25, 2010

(51) Int. Cl.
  *H03B 21/00* (2006.01)
(52) U.S. Cl. ...................................... 327/107
(58) Field of Classification Search ......... 327/105–107
  See application file for complete search history.

(56) References Cited

U.S. PATENT DOCUMENTS

| | | | |
|---|---|---|---|
| 6,707,727 B2 * | 3/2004 | Tamura et al. | 365/192 |
| 7,181,180 B1 * | 2/2007 | Teo et al. | 455/260 |
| 7,256,627 B1 * | 8/2007 | Talbot et al. | 327/141 |
| 7,312,642 B1 * | 12/2007 | Li et al. | 327/105 |
| 7,315,596 B2 * | 1/2008 | Payne et al. | 375/355 |
| 2004/0212412 A1 | 10/2004 | Saeki | |
| 2006/0001494 A1 * | 1/2006 | Garlepp et al. | 331/2 |
| 2007/0001882 A1 | 1/2007 | Zhang et al. | |
| 2007/0041486 A1 | 2/2007 | Shin | |
| 2008/0063125 A1 * | 3/2008 | Chatwin | 375/355 |
| 2008/0231331 A1 | 9/2008 | Balraj et al. | |

OTHER PUBLICATIONS

Shen, D.-S.; Liu, S.-I., "A Low-Jitter Spread Spectrum Clock Generator Using FDMP," Circuits and Systems II: Express Briefs, IEEE Transactions on , vol. 54, No. 11, pp. 979-983, Nov. 2007.

Damphousse, S.; Ouici, K.; Rizki, A.; Mallinson, M., "All Digital Spread Spectrum Clock Generator for EMI Reduction," Solid-State Circuits, IEEE Journal of , vol. 42, No. 1, pp. 145-150, Jan. 2007.

Kokubo, M.; Kawamoto, T.; Oshima, T.; Noto, T.; Suzuki, M.; Suzuki, S.; Hayasaka, T.; Takahashi, T.; Kasai, J., "Spread-spectrum clock generator for serial ATA using fractional PLL controlled by Delta-Sigma modulator with level shifter," Solid-State Circuits Conference, 2005. Digest of Technical Papers. ISSCC. 2005 IEEE International , vol., No., pp. 160-590 vol. 1, Feb. 10-10, 2005.

Yi-Bin Hsieh; Yao-Huang Kao, "A Fully Integrated Spread Spectrum Clock Generator Using Two-Point Delta-Sigma Modulation," Circuits and Systems, 2007. ISCAS 2007. IEEE International Symposium on , vol., No., pp. 2156-2159, May 27-30, 2007.

(Continued)

*Primary Examiner*—Lincoln Donovan
*Assistant Examiner*—William Hernandez
(74) *Attorney, Agent, or Firm*—Blakely, Sokoloff, Taylor & Zafman LLP

(57) ABSTRACT

An apparatus for clock generation is presented. In one embodiment, the apparatus comprises a phase interpolator that generates an output with a phase value within reference phases associated with two input clocks. Logic units are coupled to determine a number of phase settings for the phase interpolator. A divider is coupled to the phase interpolator to generate an output clock based on a modifiable divider setting.

26 Claims, 7 Drawing Sheets

OTHER PUBLICATIONS

USPTO, "First Office Action", U.S. Appl. No. 11/726,911, Mailed Jan. 7, 2010, whole document.

Final Office Action for U.S. Appl. No. 11/726,911, Mailed Jul. 2, 2010, 9 pages.

* cited by examiner

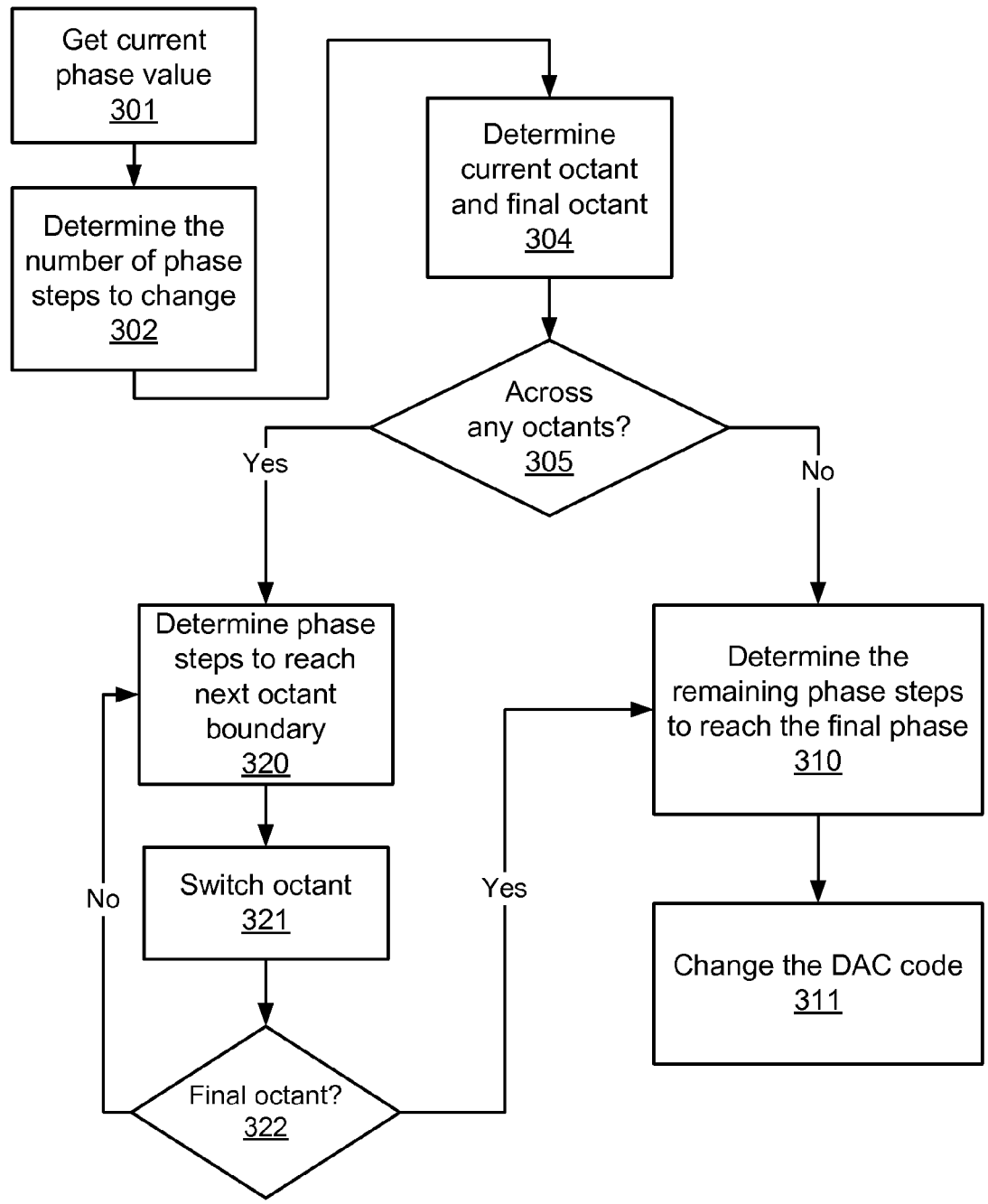

SYNCHRONOUS FREQUENCY SYNTHESIZER

FIELD OF THE INVENTION

Embodiments of the invention relate to clock generation, more specifically to synchronous frequency synthesizers.

BACKGROUND OF THE INVENTION

Computers use a clock multiplier to multiply lower frequency external clock signals to high frequency clock signals. Such multipliers may be used to allow microprocessors or a portion thereof to operate at a higher frequency than other parts of a system. Alternatively, a high frequency clock signal for microprocessors may be divided down to a lower frequency to cater for operations of input/output buses, such as, for example, SATA (Serial ATA), AGP (Accelerated Graphics Port), PCI-E (Peripheral Component Interconnect Express), SCSI (Small Computer System Interface). In general, integrated circuits utilize a clock signal in order to synchronize different parts of the IC.

Overclocking occurs when setting a computer component (e.g., a microprocessor) to run at a higher clock frequency than it is designated by the manufacturer. Some manufacturers conduct testing under an overclocking environment to determine the safety margins of components under different operating conditions. Underclocking, also known as downclocking, occurs when modifying the operating frequency of a synchronous circuit to run at a lower clock frequency than the specification. Conventional circuits perform overclocking or underclocking by modifying a divider/multiplier ratio of a clock generation circuit. The clock frequency changes abruptly whenever a new divider/multiplier ratio is set. As a result, the circuits have to shut down or use an alternative clock signal, while the clock signal is being changed, to avoid potential erroneous operations.

Phase locked loop are commonly used to generate clock signals for use in computer systems. Some phase locked loop designs incorporate a phase interpolator circuit to fine-tune the phase value of the output clock. For such designs, the phase setting of the phase interpolator circuit remains unchanged if the targeted phase value is obtained after a fine-tuning process.

BRIEF DESCRIPTION OF THE DRAWINGS

Embodiments of the present invention will be understood more fully from the detailed description given below and from the accompanying drawings of various embodiments of the invention, which, however, should not be taken to limit the invention to the specific embodiments, but are for explanation and understanding only.

FIG. 3 is a flow diagram of one embodiment of a process to change the frequency of the output clock.

DETAILED DESCRIPTION OF THE INVENTION

Embodiments of an apparatus for generating a clock signal are described. In one embodiment, a frequency synthesizer comprises a phase interpolator, a divider, and logic to determine phase settings of the phase interpolator. Embodiments may be used in conjunction with multi-core processors and input/output devices operating at different frequencies.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that with these drawing, as well as others in this disclosure, signals are represented with lines. Some may be thicker, to indicate more constituent signal paths, and/or have arrows at one or more ends, to indicate primary information flow direction. This is not intended to be limiting. Rather, it is used in connection with one or more exemplary embodiments to facilitate easier understanding of a circuit. Any represented signal, as dictated by design needs or preferences, may actually comprise one ore more signals that may travel in either direction any may be implemented with any suitable type of signal scheme, e.g., differential pair, single-ended, etc.)

Overview

Figure 1:
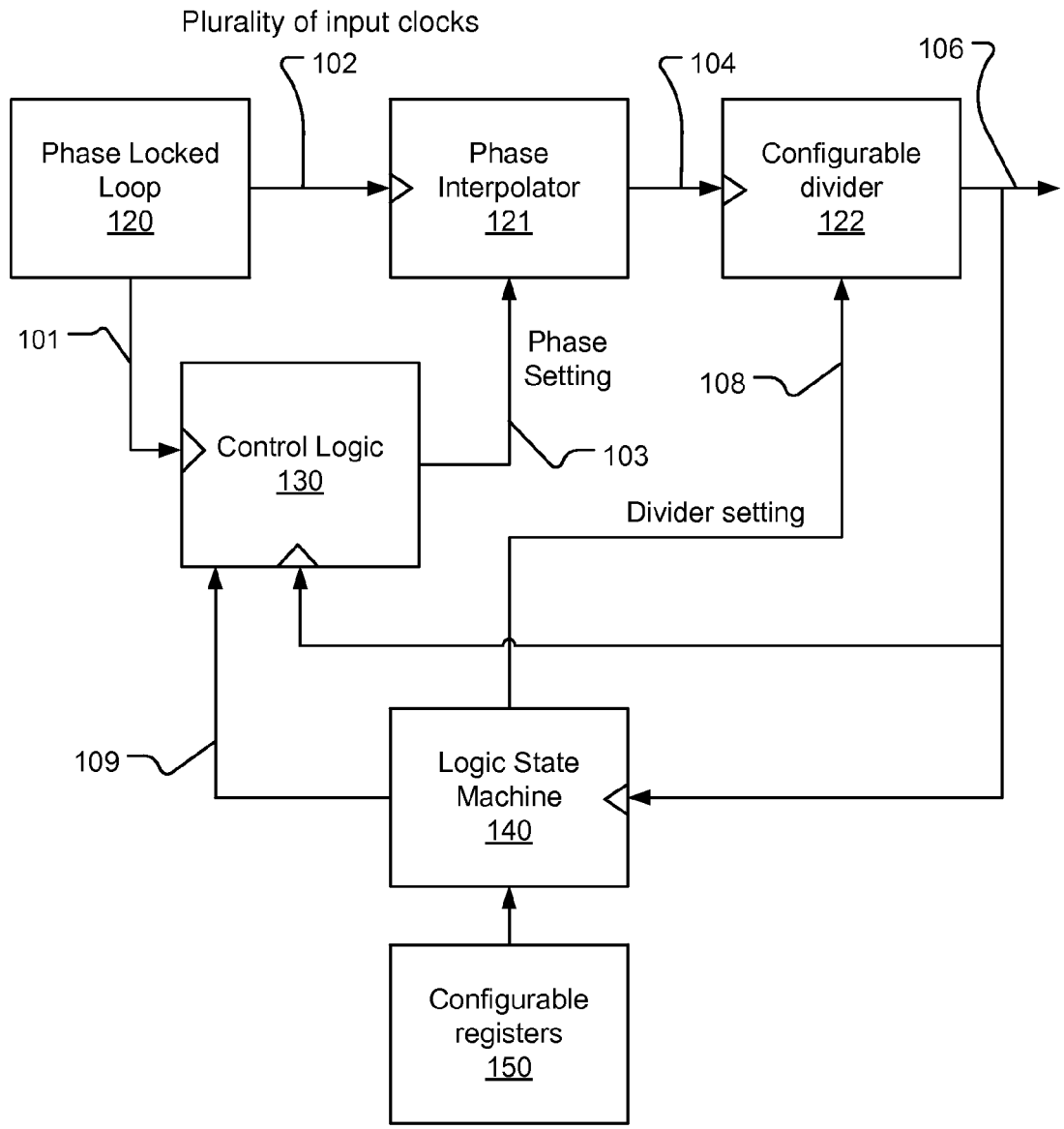
FIG. 1 is a block diagram of one embodiment of a synchronous frequency synthesizer.

FIG. 1 is a block diagram of one embodiment of a synchronous frequency synthesizer. Many related components such as buses and peripherals have not been shown to avoid obscuring the invention. Referring to FIG. 1, the synchronous frequency synthesizer comprises phase locked loop 120, phase interpolator 121, configurable divider 122, control logic 130, logic state machine 140, and configurable registers 150. The output of the synchronous frequency synthesizer is output clock 106 which is a clock signal. In one embodiment, computer components such as, for example, I/O devices, memory components, storage devices, and computer data bus controllers use output clock 106 as an operating clock signal.

In one embodiment, phase interpolator 121 is coupled to phase locked loop 120, control logic 130, and configurable divider 122. In one embodiment, control logic 130 is coupled to phase locked loop 120, output clock 106 from configurable divider 122, phase interpolator 121, and logic state machine 140. In one embodiment, logic state machine 140 is coupled to configurable divider 122, control logic 130, and configurable registers 150.

Figure 2:
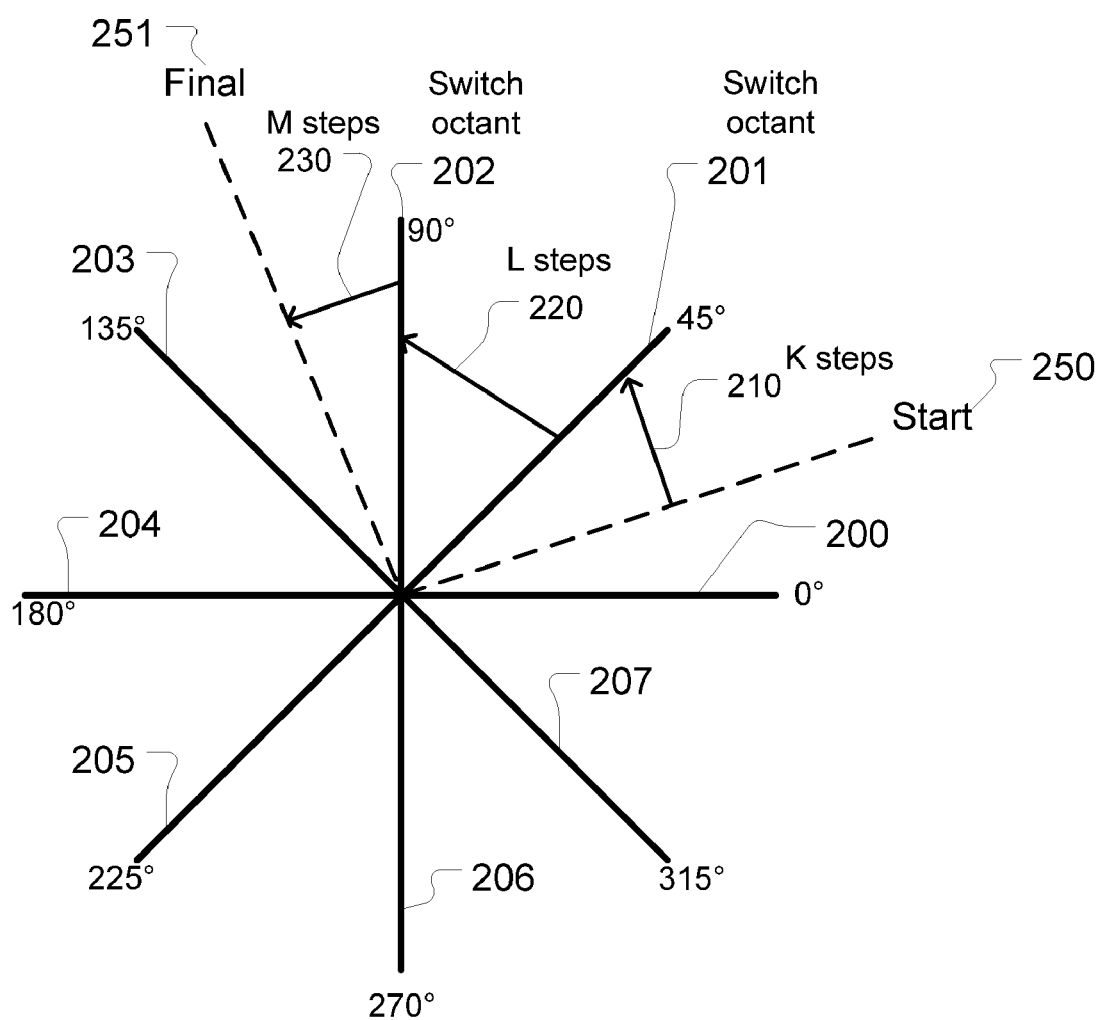
FIG. 2 shows a phase plane diagram illustrating shifting phase values of a clock signal in accordance with one embodiment of the invention.

In one embodiment, phase interpolator 121 receives eight input clocks 102 from phase locked loop 120. In one embodiment, phase locked loop 120 generates eight input clocks 102 based on a reference clock (not shown). The phase values of input clocks 102 (also known as reference phases) are different and the phase values are distributed evenly about a phase plane as shown in FIG. 2. It will be appreciated by those skilled in the art that the number of input clocks 102 may be increased or decreased according to design requirements.

In one embodiment, phase locked loop 120 receives a reference clock from a clock source (not shown). The frequency of the reference clock is the same frequency as input clocks 102. In one embodiment, the frequency of the reference clock is different from the frequency of input clocks 102 if phase locked loop 120 incorporates frequency division in a feedback loop therein. In one embodiment, a delay locked loop (DLL) is used to generate input clocks 102.

In one embodiment, a consecutive input clock is a clock signal with the next higher reference phase or the next lower reference phase about a phase plane. In one embodiment, phase interpolator 121 receives phase setting 103 from control logic 130. Phase setting 103 comprises a DAC code and selection data to select two input clocks. Based on phase setting 103, phase interpolator selects two consecutive input clocks (of the eight input clocks 102) and generates output 104 which is a weighted average of the two selected input clocks. In other words, the phase value of output 104 is within two reference phases of the two selected input clocks. The amount of weighting for each selected input clock is determined by the DAC code.

In one embodiment, another suitable phase interpolator is used to generate clock signals with controllable phase based on a weighting for two selected reference phases about a phase plane.

In one embodiment, a phase step is the resolution of phase values of output 104. The resolution is based on factors such as, for example, the number of bits in a DAC code, the clock period of input clocks 102, and the number of input clocks 102. In one embodiment, the clock period of input clocks 102 is approximately 416.67 ps (clock frequency is 2.4 GHz). A phase step of output 104 is equal to 416.67 ps divided by eight (eight input clocks 102) and further divided by $2^n$, where n is the number of bits in a DAC code. In one embodiment, a DAC code is 4 bits in length. The number of phase steps within two consecutive reference phases is 16. Therefore, each phase step of output 104 is approximately 3.25 ps.

In one embodiment, phase steps increment (positive phase delay) increases the phase value of output 104. Phase steps decrement (negative phase delay) reduces the phase value of output 104. With the same example above, to extend one clock period of output 104 for 6.5 ps, the phase value of output 104 is increased by two phase steps (each phase step contributes about 3.25 ps). In one embodiment, to reduce the clock period of output 104 by 32.5 ps, the phase value of output 104 is decreased by 10 phase steps. Some longer phase delay requires phase interpolator 121 to switch to another combination of two input clocks, in conjunction with another DAC code. In one embodiment, only one of the two input clocks is different when phase interpolator 121 switches to a new combination of input clocks. The operation will be described in further details below with additional references to the remaining figures.

In one embodiment, configurable divider 122 receives divider setting 108 from logic state machines 140. Configurable divider 122 generates output clock 106 based on divider setting 108. For example, if divider setting 108 is set to 24, configurable divider 122 generates one clock cycle at output clock 106 for every 24 clock cycles of output 104. If divider setting 108 is set to 23, configurable divider 122 generates one clock cycle of output clock 106 for every 23 clock cycles of output 104.

In one embodiment, configurable divider 122 is a Johnson counter. In one embodiment, instead of detecting the number of clock cycles, configurable divider 122 detects the number of positive edges or the number of negative edges at output 104. According to one embodiment of the invention, an exemplary frequency of input clocks 102 is 2.4 GHz. Divider setting 108 is set to codes representing values such as, for example, 24, 20, or 18 to generate output clock 106 with frequencies 100 MHz, 120 MHz, or 133 MHz respectively.

In one embodiment, logic state machine 140 determines a total number of phase steps to shift for changing the frequency at output clock 106 in conjunction with the effect of configurable divider 122. In one embodiment, data 109 comprises the total number of phase steps. In one embodiment, logic state machine 140 sends data 109 to control logic 130.

In one embodiment, control logic 130 determines a series of phase settings 103 based on data 109. In one embodiment, control logic 130 generates phase setting 103 to introduce phase delays to one or more clock cycles of output 104. The accumulated delay value propagates forwards and increases the clock period of output clock 106.

In one embodiment, for example, divider setting 108 is set to 24 and a clock period at output clock 106 corresponds to 24 clock periods at output 104. In one embodiment, control logic 130 generates phase settings such that phase interpolator 121 increases two phase steps to the third clock cycle of the 24 clock cycles and increases 3 phase steps to the forth clock cycle of the 24 clock cycles. If each phase step is equivalent to 3.25 ps, the total period of the 24 clock cycles is extended by an accumulated phase delay about 16.25 ps (i.e., 2×3.25 ps+3×3.25 ps). As a consequence, the clock period of output clock 106 increases and the frequency of output clock 106 decreases. In one embodiment, the frequency of output 106 is increased by introducing negative phase delay (i.e., shortening the clock period) to one or more clock cycles of output 104.

In one embodiment, increasing the value of a DAC code by one corresponds to shifting one phase step. In one embodiment, the phase value of the phase interpolator continues to shift about a phase plane in order to generate a desired frequency at output clock.

In one embodiment, logic state machine 140 operates at a lower frequency than the operating frequency of control logic 130. In one embodiment, logic state machine 140 updates data 109 at the frequency of output clock 106.

In one embodiment, control logic 130 operates at a frequency similar to the frequency of input clocks 102. In one embodiment, control logic 130 updates phase setting 103 at every clock cycle of its operating clock. In one embodiment, control logic 130 operates at a frequency lower than the frequency of input clocks 102 and updates phase setting 103 for every several clock cycles of input clocks 102. In one embodiment, control logic 130 operates at a half frequency of the input clocks 102 and updates phase setting 103 at positive edges and negative edges of its operating clock.

In one embodiment, phase interpolator 121, configurable divider 122, control logic 130, and logic state machine 140 operate in conjunction with different clock signals derived from a same clock source. The design complexity is reduced because the clock signals are synchronous to each others in this case.

In one embodiment, logic state machine 140 determines the frequency of output clock 106 based on the values of configurable registers 150. In one embodiment, users set configurable registers 150 multiple times, to increase/decrease the frequency of output clock 106 by a small value each time, to reach a final frequency. In one embodiment, users set a frequency profile and a final frequency value in configurable registers 150. Logic state machine 140 determines multiple rounds of frequency changes to reach the final frequency value based on the frequency profile.

In one embodiment, phase delays occur in one or more clock cycles of output 104, however only the effect of accumulated delay is observed at output clock 106. Therefore, when output clock 106 is set to a frequency, the clock period of each clock cycle of output clock 106 remains the same even though the clock period for each clock cycle of output 104 may be different. In one embodiment, the clock period of each clock cycle of output 104 changes based on phase setting 103 and therefore may not be suitable to use directly as a clock source for other circuits.

In one embodiment, manipulating the accumulated phase delay changes the frequency of output clock 106 at a smaller increment (or decrement) as compared to the method of changing divider setting 108. In one embodiment, changing divider setting 108 causes coarse frequency tuning to output clock 106. In one embodiment, frequency changes to the output clock 106 are performed by changing divider setting 108, manipulating the accumulated phase delays, or the combination of both.

In one embodiment, configurable divider 122 is designed to produce clock periods with duty cycles, such as, but not limited to 50% and 60%.

FIG. 2 shows a phase plane diagram illustrating shifting of phase values in accordance with one embodiment of the invention. Referring to FIG. 2, in one embodiment, a phase interpolator receives eight input clocks associated with different reference phases distributed evenly about the phase plane diagram (i.e., 0°, 45°, 90°, 135°, 180°, 225°, 275°, and 315° respectively). The reference phases (also known as octant boundaries) divide the 360° phase plane into eight octants. In one embodiment, the first octant (0° to 45°) is bounded by octant boundary 200 and octant boundary 201; the second octant (45° to 90°) is bounded by octant boundary 201 and octant boundary 202. Each octant boundary (i.e., octant boundaries, 200, 201, 202, 203, 204, 205, 206, and 207) corresponds to a clock signal associated with a reference phase.

In one embodiment, a phase interpolator is operable to generate clock signals with controllable phase values, based on a weighting (DAC code), between a pair of reference phases. In one embodiment, to avoid potential glitches, the process of increasing/decreasing a phase value that causes changing to another octant or crossing an octant boundary is performed by: (1) shifting a number of phase steps so that the phase value reaches the octant boundary and (2) switching one of the two input clocks at the octant boundary. In one embodiment, each step is performed in different clock cycle of the phase interpolator's operating clock.

In one embodiment, a sequence of phase settings is provided to the phase interpolator to perform the operation. Referring to FIG. 2, in one embodiment, the phase interpolator interpolates input clock 0° and input clock 45° to produce a signal with first phase value 250. Changing from first phase value 250 to final phase value 251 crosses two octant boundaries (i.e., octant boundaries 201 and 202). The phase interpolator changes the phase value by shifting K phase steps (210) to octant boundary 201. In one embodiment, shifting K phase steps is performed by changing the DAC code of the phase setting. Subsequently, the phase interpolator switches to another pair of input clocks (input clock 45° and input clock 90°). The phase interpolator increases the phase value by L phase steps (220) to reach octant boundary 202. Following this, the phase interpolator switches to another pair of input clocks (input clock 90° and input clock 135°). Finally, the phase interpolator increases phase value by shifting M phase steps (the remaining phase steps, 230) to reach final phase value 251.

FIG. 3 is a flow diagram of one embodiment of a process to change the frequency of an output clock. The process is performed by processing logic that may comprise hardware (circuitry, dedicated logic, etc.), software (such as one that is run on a general purpose computer system or a dedicated machine), or a combination of both. In one embodiment, the process is performed by control logic 130 as discussed in relation to FIG. 1.

Referring to FIG. 3, the process begins by processing logic determines the current phase value of a phase interpolator (process block 301). Then, processing logic determines a total number of phase steps that is required to generate output clock given a desired frequency (process block 302). Processing logic determines a current octant for the current phase value and a final octant for the final phase value (processing block 304). Processing logic also determines whether changing the phase value requires crossing any octant boundaries (e.g., one or more octant boundaries) (process block 305).

In one embodiment, if shifting to the final phase value does not cross any octant boundary, processing logic determines the number of remaining phase steps to reach the final phase value (process block 310). In one embodiment, processing logic determines the DAC code of the final phase value based on the number of remaining phase steps (process block 311).

In one embodiment, if shifting to final phase value requires crossing any octant boundaries (e.g., one or more octant boundaries), processing logic determines the number of phase steps to reach the next octant boundary and changes the DAC code accordingly (process block 320). At the octant boundary, processing logic switches one of the two input clocks (to switch to the next octant) (process block 321). Following this, processing logic determines whether the current octant is the final octant (process block 322). In one embodiment, if shifting to final phase value does not cross any other octant boundary, processing logic determines the remaining phase steps to the final phase value and changes the DAC code accordingly (process blocks 310, 311). Otherwise, processing logic repeats process block 320 and process block 321 to cross any octant boundary. In one embodiment, processing logic continues to repeat process block 320 and process block 321 until the current octant is the final octant.

While in an exemplary embodiment the number of input clocks is eight and hence the phase plane diagram is distributed into eight octants evenly. It should be appreciated that alternate embodiments may involve other implementations of the number of input clocks. For example, the number of input clock is four in one embodiment, or sixteen in another embodiment.

Figure 4A:
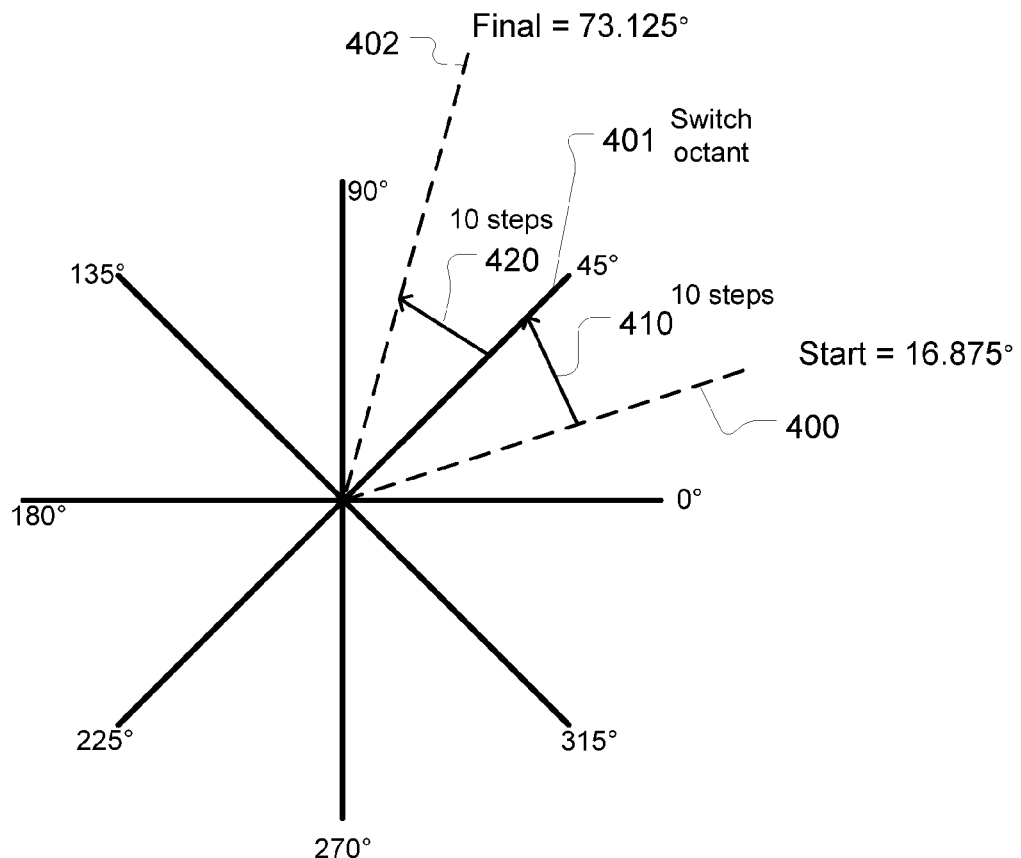
FIG. 4a shows a phase plane diagram for an underclocking operation in accordance with one embodiment of the invention.
Figure 4B:
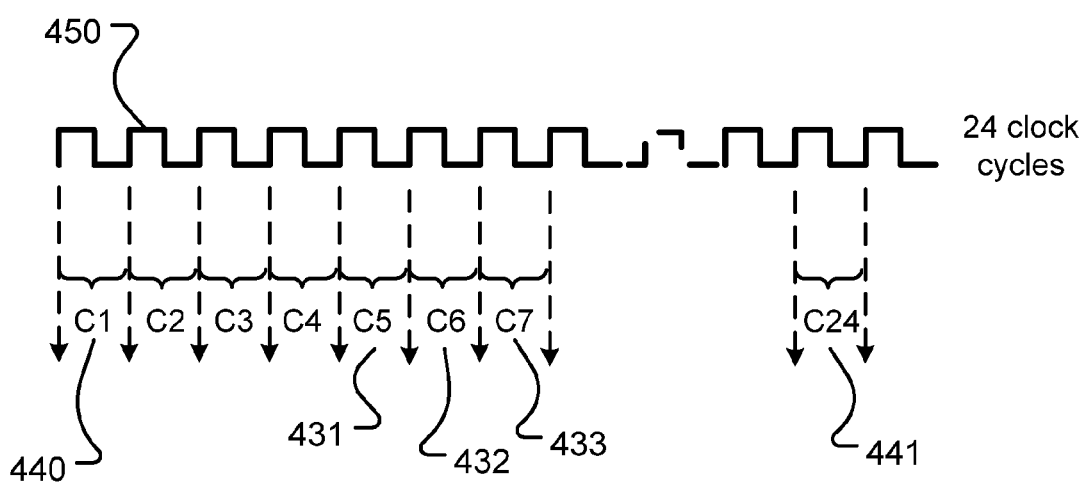
FIG. 4b is a waveform diagram for an underclocking operation in accordance with one embodiment of the invention.

FIG. 4a shows a phase plane diagram for an underclocking operation in accordance with one embodiment of the invention. FIG. 4b is a waveform diagram for an underclocking operation in accordance with one embodiment of the invention. In this example, the initial output frequency is 100 MHz and the targeted frequency for the underclocking operation is about 99.353 MHz.

With reference to FIG. 1, in one embodiment, the frequency of input clocks 102 is 2.4 GHz, and the corresponding clock period is about 416.67 ps. Phase interpolator 121 receives 8 input clocks. Divider setting 108 is set to 24 hence generating output clock 106 with a frequency about 100 MHz (clock period is 10000 ps). In one embodiment, each clock cycle of output clock 106 is equivalent to 24 clock cycles of output 104. The DAC code is 4 bits in length. With these settings, the phase plane diagram in FIG. 4a is divided into 8 octants. Each octant is divided into 16 phase steps and each phase step is equivalent to about 3.25 ps. The starting phase value 400 is equal to 16.875° which also corresponds to about 6 phase steps above the reference phase 0°.

In one embodiment, to reduce the output frequency from 100 MHz (clock period 10000 ps) to 99.353 MHz (clock period=10065.12 ps), the accumulated phase delay is about 65.12 ps. The total number of phase steps is 20 phase steps (i.e., 65.12 ps divided by 3.25 ps per phase step). Shifting 20 phase steps (from the starting phase value 400) crosses octant boundary 45°. In one embodiment, based on phase setting 103, phase interpolator 121 increases the phase value by 10 phase steps (about 32.5 ps) to reach octant boundary 45°. At the octant boundary, phase interpolator 121 receives phase setting 103 and switches to another pair of input clocks (input clock 45° and input clock 90°). In one embodiment, the phase value does not change (hence no additional phase delay) when switching the input clocks is performed. For the next clock cycle, phase interpolator 121 increases the phase value by 10 phase steps (i.e., the remaining phase steps: 20–10) and introduces about 32.5 ps phase delay to the clock cycles. After the three clock cycles, the accumulated phase delay is approximately 65 ps.

In one embodiment, FIG. 4b shows the 24 clock cycles of output 104 based on the same example described above. In one embodiment, the 24 clock cycles corresponds to one clock cycle of output clock 106. In one embodiment, phase delays are introduced to clock cycles in the middle rather than to the first few clock cycles and to the last few clock cycles of the 24 clock cycles.

In one embodiment, referring to FIG. 4b, clock cycle 440 is the first clock cycle and clock cycle 441 is the last cycle of the 24 clock cycles. Based on a sequence of phase settings, phase interpolator 121 increases the phase value by 10 phase steps at clock cycle 431, switches one of the two input clocks at clock cycle 432, and increases the phase value again by the remaining 10 phase steps at clock cycle 433. The total time period of the 24 clock cycles is therefore equal to 10065 ps (a sum of 22 clock cycles of 416.67 ps and 2 clock cycles of 449.17 ps).

The corresponding frequency resolution for different configurations of one embodiment of invention are shown in the following table:

TABLE 1

Resolution of Output Frequency

| BASE OUTPUT FREQUENCY | PHASE STEP RESOLUTION | RESOLUTION OF THE OUTPUT FREQUENCY (%) |
|---|---|---|
| 100 MHz | 3.25 ps | 0.032% |
| 120 MHz | 3.25 ps | 0.043% |
| 133 MHz | 3.25 ps | 0.053% |

The following tables show examples of calculation in accordance to embodiments of invention. In one embodiment, the maximum frequency change is 4.06% below the base output frequency and is 4.28% above the base output frequency with the same divider setting 108.

TABLE 2

Calculation Example of Maximum Frequency Change

| ITEM | CALCULATION |
|---|---|
| Frequency and clock period of input clocks | 2.4 GHz; 416.67 ps |
| Base Clock Frequency | 133 MHz; 7,520 ps |
| Number of input clock cycles in one output clock cycle | 7520 ps/416.67 ps = 18 |
| Phase interpolator setup and settling time | 6 clock cycles |
| Maximum number of octants that can be changed in one output clock cycle | (18-6)/2 = 6 *2 clock cycles to change one octant |
| The maximum accumulated phase delay is approximately (underclocking) | 312.25 ps |

TABLE 2-continued

Calculation Example of Maximum Frequency Change

| ITEM | CALCULATION |
|---|---|
| The minimum frequency of the output clock (underclocking) | 1/(7520 + 312.25) = 127.6 MHz |
| The percentage of the frequency change (underclocking) | 4.06%. |
| The maximum accumulated phase delay is approximately (overclocking) | −312.25 ps |
| The maximum frequency of the output clock (overclocking) | 1/(7520 − 312.25) = 138.7 MHz |
| The percentage of the frequency change (overclocking) | 4.28%. |

In one embodiment, divider setting 108 is set to 24, and the base frequency is 100 MHz. By different values of accumulated phase delay, an output frequency is able to decrease to about 95.55 MHz (underclocking condition) and increase to about 104.37 MHz (overclocking condition). The maximum frequency change is 4.45% below the base output frequency and 4.37% above the base output frequency. In one embodiment, the accumulated phase delay is increased step-by-step so that the frequency of output clock changes at a small increment/decrement.

Figure 5:
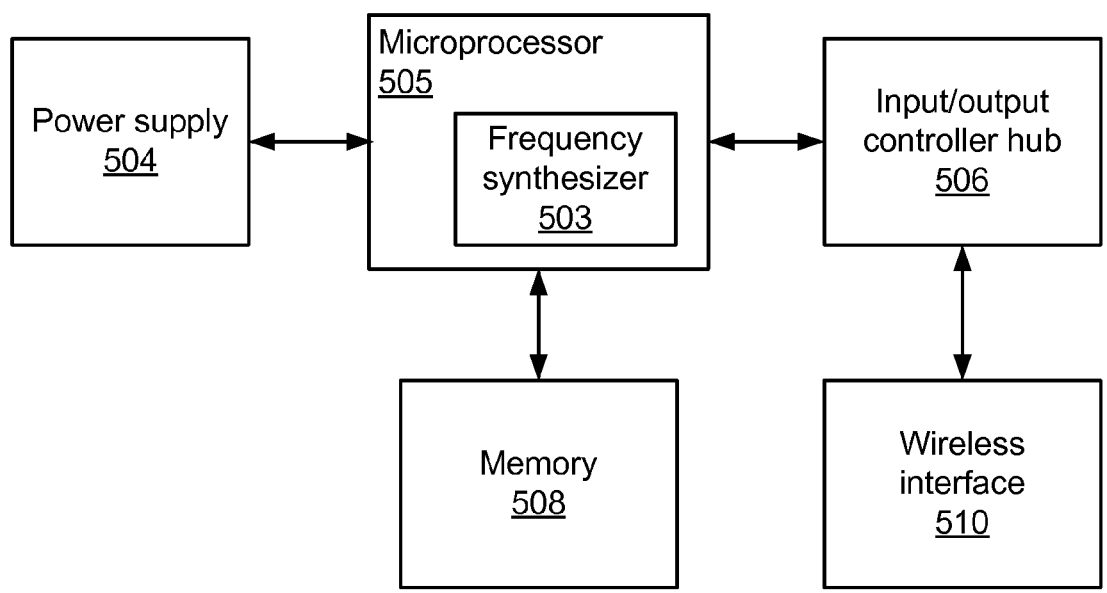
FIG. 5 illustrates a block diagram of one embodiment of the invention in conjunction with a computer system.

FIG. 5 illustrates a block diagram of one embodiment of the invention in conjunction with a computer system. With reference to FIG. 5, one example of a computer system is shown. In one embodiment, the depicted system comprises processor 505 that is coupled to power supply 504, I/O controller hub 506, and memory 508. In one embodiment Processor 505 further comprises synchronous frequency synthesizer 503. Processor 505 is coupled to the power supply 504 to receive power therefrom when in operation.

In one embodiment, Processor 505 comprises one or more synchronous frequency synthesizers 503 such as are disclosed herein. In one embodiment, I/O controller hub 506 further comprises synchronous frequency synthesizer 503. In another embodiment, I/O controller hub 506 is coupled to wireless interface 510. The wireless interface 510 is coupled to an antenna to communicatively link the processor through the wireless interface chip to a wireless network (not shown).

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chipset components, programmable logic arrays (PLA), memory chips, network chips, and the like.

Figure 6:
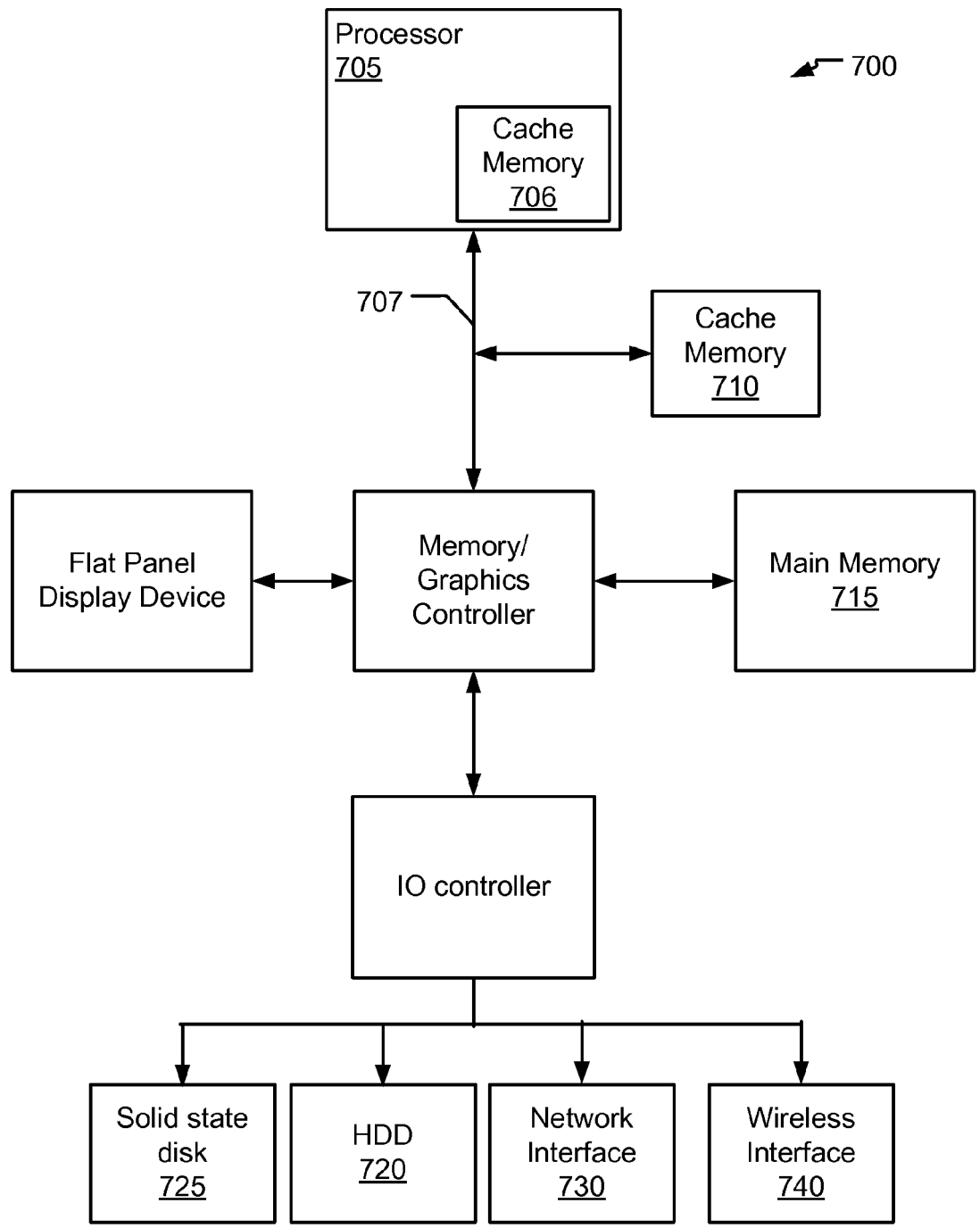
FIG. 6 illustrates a computer system for use with one embodiment of the invention.

FIG. 6 illustrates a computer system for use with one embodiment of the invention. A processor 705 accesses data from a level 1 (L1) cache memory 706, a level 2 (L2) cache memory 710, and main memory 715. In one embodiment, the cache memory 706 may be a multi-level cache memory comprise of an L1 cache together with other memory such as an L2 cache within a computer system memory hierarchy and cache memory 710 are the subsequent lower level cache memory such as an L3 cache or more multi-level cache. Furthermore, the computer system may have the cache memory 710 as a shared cache for more than one processor core. The processor 705 may have any number of processing cores.

The main memory 715 may be implemented in various memory sources, such as dynamic random-access memory (DRAM), a hard disk drive (HDD) 720, a solid state disk 725 based on NVRAM technology, or a memory source located remotely from the computer system via network interface 730 or via wireless interface 740 containing various storage devices and technologies. The cache memory may be located either within the processor or in close proximity to the processor, such as on the processor's local bus 707.

Other embodiments of the invention, however, may exist in other circuits, logic units, or devices within the system of FIG. 6. Furthermore, in other embodiments of the invention may be distributed throughout several circuits, logic units, or devices in the form of hardware, software, or some combination thereof as illustrated in FIG. 6.

Figure 7:
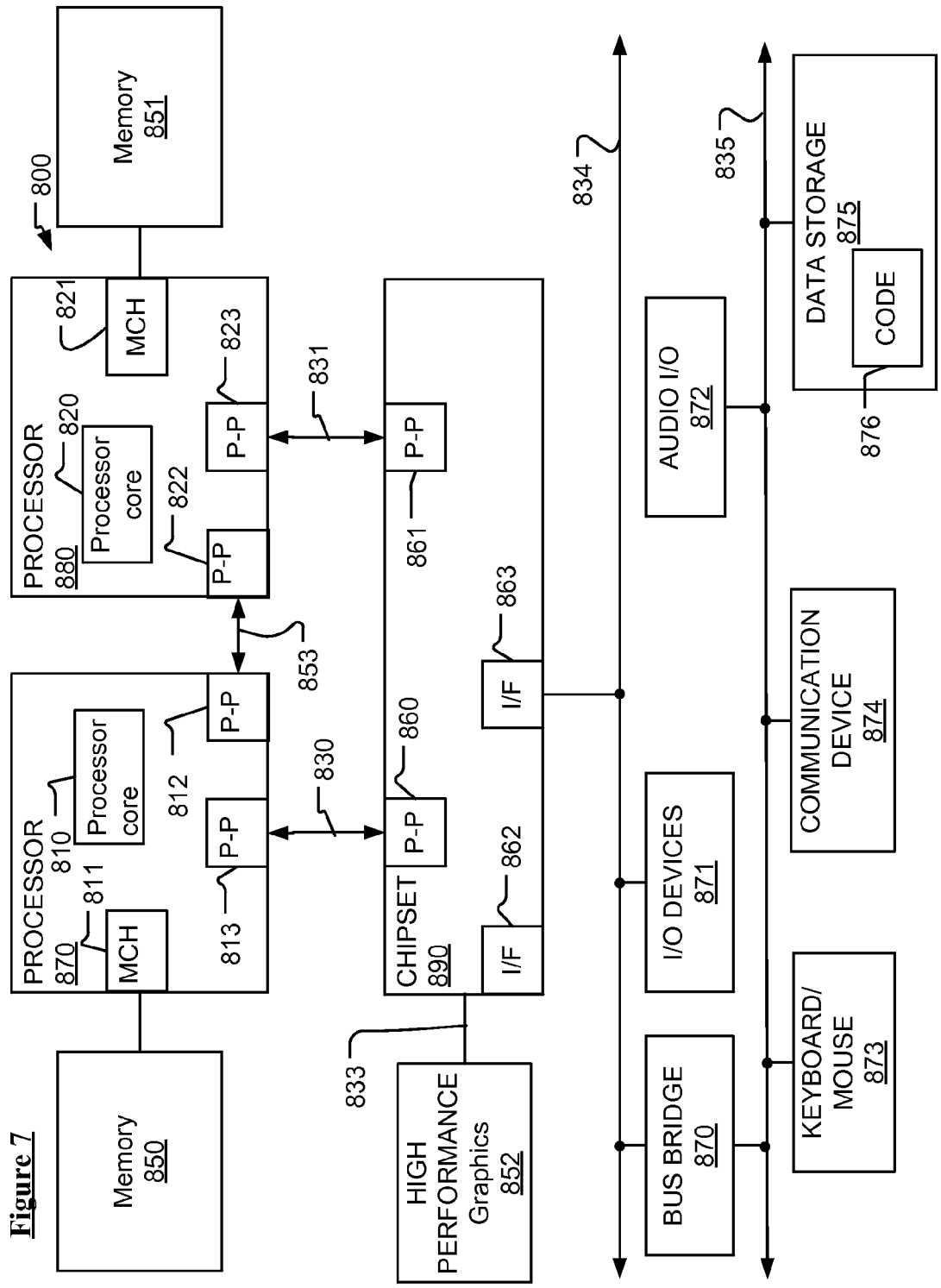
FIG. 7 illustrates a point-to-point computer system for use with one embodiment of the invention.

FIG. 7 illustrates a point-to-point computer system for use with one embodiment of the invention. In particular, FIG. 7 shows a system where processors, memory, and input/output devices are interconnected by a number of point-to-point interfaces.

The system of FIG. 7 may also include several processors, of which only two, processors 870, 880 are shown for clarity. Processors 870, 880 may each include a local memory controller hub (MCH) 811, 821 to connect with memory 850, 851. Processors 870, 880 may exchange data via a point-to-point (PtP) interface 853 using PtP interface circuits 812, 822. Processors 870, 880 may each exchange data with a chipset 890 via individual PtP interfaces 830, 831 using point to point interface circuits 813, 823, 860, 861. Chipset 890 may also exchange data with a high-performance graphics circuit 852 via a high-performance graphics interface 862. Embodiments of the invention may be coupled to computer bus (834 or 835), or within chipset 890, or coupled to data storage 875, or coupled to memory 850 of FIG. 7.

Other embodiments of the invention, however, may exist in other circuits, logic units, or devices within the system of FIG. 7. Furthermore, in other embodiments of the invention may be distributed throughout several circuits, logic units, or devices illustrated in FIG. 7.

Moreover, it will be appreciated that example sizes/models/values/ranges may have been given, although embodiments of the present invention are not limited to the same. As manufacturing techniques (e.g., photolithography) mature over time, it is expected that devices of smaller size could be manufactured.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. An apparatus comprising:
    a phase interpolator, coupled to a plurality of input clocks, to receive a first phase setting and to generate a first output with a first phase value within reference phases associated with two input clocks from the plurality of the input clocks;
    a first logic unit to determine a first data including a number of phase steps;
    a divider coupled to the first output to generate an output clock with a first frequency value based on a modifiable divider setting and based on the number of phase steps; and
    a second logic unit to determine a plurality of phase settings based on the number of phase steps.

2. The apparatus of claim 1, wherein the plurality of phase settings comprise a second phase setting to generate a clock cycle at the first output based only on a first input clock if the number of phase steps spans across a first reference phase associated with the first input clock.

3. The apparatus of claim 1, wherein the plurality of phase settings comprise a second number of different phase settings, the second number being less than or equal to a divider value based on the divider setting, the second number being equal to or larger than two times a third number of reference phases across which the number of phase steps span.

4. The apparatus of claim 1, wherein the plurality of phase settings comprise:
    a second phase setting such that the first output is based only on a first input clock, the two input clocks being the first input clock and a second input clock; and
    a third phase setting such that the first output is based only the first input clock, the two input clocks being the first input clock with a third input clock.

5. The apparatus of claim 1, wherein the first logic unit comprises a state machine coupled to receive the output clock and is to operate at the first frequency value.

6. The apparatus of claim 1, wherein the second logic unit is operable at a second frequency value higher than the first frequency value but lower or equal to a frequency value of the input clocks.

7. The apparatus of claim 1, wherein the first data further includes the divider setting of the divider.

8. The apparatus of claim 1, further comprising a firmware configurable register coupled to the first logic unit.

9. The apparatus of claim 1, further comprising a phase locked loop circuit to generate the input clocks.

10. The apparatus of claim 1, wherein the first frequency value is changeable in the range from 0.06% to 4.00% of the first frequency value by setting the number of phase steps.

11. A method comprising:
    determining a first number of phase steps to generate an output clock;
    determining a final phase setting of a phase interpolator to generate the output clock, the determining based on the first number of phase steps and a current phase setting of the phase interpolator;
    calculating a second number of phase steps to a reference phase associated with a first input clock of the phase interpolator, wherein the second number of phase steps is less than or equal to the first number of phase steps; and
    setting the current phase setting according to the second number of phase steps.

12. The method of 11, further comprising:
    switching the current phase setting to generate a first output of the phase interpolator from the first input clock only; and
    switching the current phase setting to generate the first output of the phase interpolator by interpolating the first input clock and a second input clock.

13. The method of 11, further comprising:
    calculating a third number of phase steps to reach the final phase setting, and setting the current phase setting according to the third number of phase steps.

14. The method of claim 13, wherein the third number of phase steps is a remaining number of phase steps of subtracting the second number of phase steps from the first number of phase steps.

15. The method of 11, further comprising determining whether changing the current phase setting to the final phase setting requires crossing one or more reference phases associated with input clocks of the phase interpolator.

16. The method of 11, further comprising determining a plurality of phase settings associated with one or more reference phases associated with input clocks of the phase interpolator if changing to the final phase setting requires crossing the one or more reference phases.

17. The method of 11, wherein setting the current phase setting according to the second number of phase steps comprises changing a DAC code of the phase interpolator.

18. A computer system comprising:
a processor coupled to an input/output device;
a clock circuitry coupled to provide a clock signal to the input/output device,
wherein the clock circuitry comprises:
a phase interpolator, coupled to a plurality of input clocks, to receive a first phase setting and to generate a first output with a first phase value within reference phases associated with two input clocks from the plurality of the input clocks;
a first logic unit to determine a first data including a number of phase steps;
a divider coupled to the first output to generate an output clock with a first frequency value based on a modifiable divider setting and based on the number of phase steps; and
a second logic unit to determine a plurality of phase settings based on the number of phase steps.

19. The computer system of claim 18, wherein the plurality of phase settings comprise a second phase setting to generate a clock cycle at the first output based only on a first input clock if the number of phase steps spans across a first reference phase associated with the first input clock.

20. The computer system of claim 18, wherein the plurality of phase settings comprise a second number of different phase settings, the second number being less than or equal to a divider value based on the divider setting, the second number being equal to or larger than two times a third number of reference phases across which the number of phase steps span.

21. The computer system of claim 18, wherein the plurality of phase settings comprise:
a second phase setting such that the first output is based only on a first input clock, the two input clocks being the first input clock and a second input clock; and
a third phase setting such that the first output is based only the first input clock, the two input clocks being the first input clock with a third input clock.

22. The computer system of claim 18, wherein the first logic unit comprises a state machine coupled to receive the output clock and is to operate at the first frequency value.

23. The computer system of claim 18, wherein the second logic unit is operable at a second frequency value higher than the first frequency value but lower or equal to a frequency value of the input clocks.

24. The computer system of claim 18, wherein the first data further includes the divider setting of the divider.

25. The computer system of claim 18, wherein the clock circuitry further comprises a firmware configurable register coupled to the first logic unit.

26. The computer system of claim 18, wherein the clock circuitry further comprises a phase locked loop circuit to generate the input clocks.

* * * * *